(12) United States Patent
Milsom et al.

(10) Patent No.: US 8,058,768 B2
(45) Date of Patent: Nov. 15, 2011

(54) BULK ACOUSTIC WAVE RESONATOR DEVICE

(75) Inventors: Robert F. Milsom, Redhill (GB); Frederik W. M. VanHelmont, Maaseik (BE); Andreas B. M. Jansman, Nuenen (NL); Jaap Ruigrok, Asten (NL); Hans-Peter Loebl, Monschau-Imgenbroich (DE)

(73) Assignee: Triquint Semiconductor, Inc., Portland, OR (US)

( * ) Notice: Subject to any disclaimer, the term of this patent is extended or adjusted under 35 U.S.C. 154(b) by 133 days.

(21) Appl. No.: 11/915,702

(22) PCT Filed: May 23, 2006

(86) PCT No.: PCT/IB2006/051653
§ 371 (c)(1),
(2), (4) Date: Nov. 4, 2009

(87) PCT Pub. No.: WO2006/126168
PCT Pub. Date: Nov. 30, 2006

(65) Prior Publication Data
US 2010/0039000 A1  Feb. 18, 2010

(30) Foreign Application Priority Data
May 27, 2005  (EP) .................................. 05104574

(51) Int. Cl.
*H01L 41/08* (2006.01)
*H01L 41/09* (2006.01)
(52) U.S. Cl. ................. 310/313 R; 310/313 B; 310/320
(58) Field of Classification Search .................. 310/320, 310/324, 334, 363–366, 313 R, 313 B; 333/187, 333/189; H01L 41/08, 41/09; H03H 9/56
See application file for complete search history.

(56) References Cited

U.S. PATENT DOCUMENTS
3,621,309 A    11/1971  Yokoyama et al.
(Continued)

FOREIGN PATENT DOCUMENTS
CN          1389018 A        1/2003
(Continued)

OTHER PUBLICATIONS

Lakin, K. M; et al "High Performance Stacked Crystal Filters for GPS and Wide Bandwidth Applications" 2001 IEEE Ultrasonics Symposium Proceedings. Atlanta, GA, Oct. 7-10, 2001, IEEE Ultrasonics Symposium Proceedings, New York, NY: IEEE, US, vol. 2 of 2, pp. 833-838.

(Continued)

*Primary Examiner* — Walter Benson
*Assistant Examiner* — Karen B Addison
(74) *Attorney, Agent, or Firm* — Schwabe Williamson & Wyatt

(57) ABSTRACT

A bulk acoustic wave, BAW, resonator device comprising first and second metal layers (10, 20) and an intervening piezoelectric layer (30), the first metal layer (10) comprising spaced first and second portions (12, 14), wherein the first and second portions (12, 14) are each arranged as a plurality of interconnected fingers (16, 18), and wherein each of the plurality of fingers (16) of the first portion (12) is acoustically coupled to at least one of the fingers (18) of the second portion (14). In one embodiment the fingers of the first portion (12) are interlaced with the fingers (18) of the second portion (14), thereby providing direct coupling. In another embodiment the acoustic coupling between the fingers of the first and second portions is provided indirectly by further portions (15) of the first metal layer (10).

11 Claims, 16 Drawing Sheets

U.S. PATENT DOCUMENTS

| | | | |
|---|---|---|---|
| 3,836,877 A | * | 9/1974 | Guntersdorfer et al. ...... 333/187 |
| 6,194,809 B1 | * | 2/2001 | Takeuchi et al. .......... 310/313 R |
| 6,448,695 B2 | | 9/2002 | Milsom |
| 6,734,600 B2 | | 5/2004 | Aigner et al. |
| 6,903,630 B2 | * | 6/2005 | Miura et al. ............. 310/313 B |
| 7,034,634 B2 | | 4/2006 | Nakamura et al. |
| 2009/0153268 A1 | * | 6/2009 | Milsom et al. ................ 310/365 |

FOREIGN PATENT DOCUMENTS

| | | |
|---|---|---|
| JP | 58-173912 A | 10/1983 |
| JP | 59-172825 A | 9/1984 |
| JP | 62061412 A | 3/1987 |
| JP | 2002-541704 A | 12/2002 |
| JP | 2004320813 A | 12/2003 |
| JP | 2004-320813 A | 11/2004 |
| JP | 2005-092461 A | 4/2005 |

OTHER PUBLICATIONS

Ruby, R. "FBAR—From Technology Development to Production" Second International Symposium on Acoustic Wave Devices for Future Mobile Communication Systems, Chiba University, Japan, Mar. 2004, pp. 133.

Loebl, H. P; et al "Solidly Mounted Bulk Acoustic Wave Filters for the GHZ Frequency Range" IEEE Ultrasonics Symposium, Munich, Germany 2002, pp. 919.

Lakin, K. M. "Coupled Resonator Filters" IEEE Ultrasonics Symposium, Munich, Germany 2002, pp. 901.

Grudkowski, T. W; et al "Fundamental Mode VHF/UHF Bulk Acoustic Wave Resonators and Filters on Silicon" Proceedings of the IEEE Utransonics Symposium, 1980, pp. 829-833.

Werner, J. F. "The Bilithic Quartz Crystal Filter" Journal of Science and Technology, vol. 38, No. 2, 1971, pp. 74-82.

* cited by examiner

BULK ACOUSTIC WAVE RESONATOR DEVICE

The invention relates to a bulk acoustic wave (BAW) resonator device, to a filter comprising a BAW resonator device, and to an electronic apparatus comprising a BAW resonator device.

Thin-film bulk-acoustic wave (BAW) filters can provide highly miniaturized and low-cost radio-frequency (RF) and intermediate-frequency (IF) selectivity in applications such as mobile communication, wireless connectivity, and satellite and mobile digital TV. Thin-film BAW is becoming the technology of choice above about 1 GHz.

The basic building blocks of these filters are BAW resonators. A BAW resonator is essentially an acoustic cavity comprising a piezoelectric layer sandwiched between metal electrode layers. When an alternating electric signal is applied across these electrodes the energy is converted to mechanical form and a standing wave is excited. The principle mode of vibration is thickness extensional (TE) which is normal to the layers, and at a frequency for which half a wavelength is approximately equal to the thickness of the cavity. The excitation of this mode is a consequence of the orientation of the piezoelectric layer, C-axis normal, which is easier to grow than other orientations. Layers of the order of 0.1 to 2.0 μm can readily be grown, so this technology is best suited to frequencies of the order of 1 to 10 GHz.

Two main types of BAW resonator are a Film-Bulk-Acoustic-wave-Resonator (FBAR) and a Solidly-mounted-Bulk-Acoustic-wave-Resonator (SBAR or SMR). The SBAR differs from the FBAR in that the BAW resonator is mounted on a set of acoustically mismatched layers, the layers having alternately high and low acoustic impedance and each a quarter of a wavelength thick. Such reflector layers are referred to as an acoustic Bragg reflector. The Bragg reflector provides very strong reflection of the normally-incident TE mode of the acoustic wave over a band of frequencies much wider than typical filter bandwidth. The Bragg reflector is itself mounted on a solid substrate, typically of glass or silicon. The FBAR is discussed in, for example, "FBAR—from technology development to production", R. Ruby, 2nd International Symposium on Acoustic Wave Devices for Future Mobile Communication Systems, Chiba University, Japan, p. 133, March 2004. The SBAR is discussed in, for example, "Solidly mounted bulk acoustic wave (BAW) filters for the GHz range", H-P Löbl et al, IEEE Ultrasonics Symposium, Munich, p. 897, 2002.

In BAW filters the BAW resonators are interconnected electrically either in a ladder configuration, which is unbalanced, or in a lattice configuration, which is balanced, or in an architecture which is a combination of these, also usually balanced. Electrical connection imposes limitations on design flexibility, which then limits applications. In particular it is sometimes desirable to have a combination of unbalanced termination at one port, for example for connecting the filter input to an antenna, and balanced termination at the other port, for example for connecting the filter output to a low-noise amplifier (LNA). Further these terminations are likely to be at different impedances, typically 50 ohms and 150 ohms, so impedance transformation is also desirable. If this additional balun and/or impedance transformation functionality cannot be included in the filter then several additional passive components are required.

Impedance transformation can be included in a thin-film BAW filter if two resonators are included in the same stack of layers separated vertically by additional thin-film layers to provide coupling. In such a configuration connection between the two resonators is acoustic rather than electrical, i.e. an acoustic wave transmits the energy. Impedance-transformation is then achieved by electrically connecting two such stacks, where the area, and hence impedance, of the resonators in the two stacks is different. Balun functionality can also be realized. Such a structure is discussed in "Coupled Resonator Filters", K. Lakin, et al, IEEE Ultrasonics Symposium, Munich, p. 879, 2004.

This approach of vertically coupling the resonators eliminates the additional components required for balun and/or impedance transformation functionality, but there is a cost in terms of the many additional layers required which add greatly to the complexity and therefore cost of wafer processing.

In addition, there is a lack of design flexibility in this approach. Filter bandwidth is a function of the degree of acoustic coupling between the two resonators in the thin-film stack. This is controlled by the number of coupling layers, and can therefore only be adjusted in discrete steps.

It is known from the field of quartz crystal filters to place two rectangular resonators side-by-side and to employ lateral propagation of thickness shear (TS) acoustic waves between the resonators, see for example "The bilithic quartz crystal filter", J. F. Werner, J. Sci. Tech., vol. 38, pp. 74-82, 1971. In this approach filter bandwidth is controlled through the widths of the resonators and the gap between the resonators, which can be adjusted continuously. However this approach of placing two rectangular resonators side-by-side cannot be used for thin-film BAW filters employing the TE mode because the TE mode is more strongly confined to each resonator for given dimensions than a TS mode. The effect would be unacceptably high insertion loss and narrow bandwidth as illustrated in "Fundamental mode VHF/UHF bulk acoustic wave resonators and filters on silicon", T. W. Grudkowski et al, Proc. IEEE Ultrasonics Symposium, pp. 829-833, 1980, where an insertion loss of 8.5 dB was demonstrated. Resonator area is determined by the need to match to a particular impedance, typically of the order of 50 ohms, and at this impedance level a high ratio of area to thickness is required. On the other hand, so that the energy is not too strongly confined and can propagate between the electrodes, the electrodes of each resonator must be narrow in the lateral dimension, say no more than 10 times the resonator thickness. So with two adjacent areas of electrode, the electrode aspect ratio would need to be of the order of several 100. Such a device would have very high electrical resistance and consequently high insertion loss.

An object of the invention is to provide a BAW resonator device having an increased bandwidth and reduced insertion loss.

According to a first aspect of the invention there is provided a bulk acoustic wave, BAW, resonator device comprising first and second metal layers and an intervening piezoelectric layer, the first metal layer comprising spaced first and second portions, wherein the first and second portions are each arranged as a plurality of interconnected fingers, and wherein each of the plurality of fingers of the first portion is acoustically coupled to at least one of the fingers of the second portion.

By employing a plurality of fingers, acoustic coupling between the resonators defined by the first and second portions of the first metal layer is improved and electrical resistance decreased, resulting in increased bandwidth and reduced insertion loss. The acoustic coupling is lateral, between neighbouring fingers.

In one embodiment of the invention the fingers of the first portion of the first metal layer are interlaced with the fingers of the second portion of the first metal layer. Such an embodiment provides a strong acoustic coupling between adjacent fingers, with the coupling being direct between adjacent fingers.

In a second embodiment of the invention the fingers of the first portion of the first metal layer are acoustically coupled to the neighbouring fingers of the second portion indirectly by means of further portions of the first metal layer. Such an embodiment is particularly suited where impedance transformation is required because impedance is inversely proportional to area, and the areas of the input and output portions can be different.

The first and second portions of the device may be used as input and output electrodes respectively, and coupled to an input port and output port respectively. Unbalanced operation may be implemented by coupling the second metal layer to a ground path. For balanced operation, the device comprises for the second metal layer a structure corresponding to that of the first metal layer, i.e. the second metal layer comprises spaced third and fourth portions, wherein the third and fourth portions are each arranged as a plurality of interconnected fingers, wherein the fingers of the third portion are interlaced with the fingers of the fourth portion, or acoustically coupled via further portions, and wherein the fingers of the third portion are arranged opposed to the fingers of the first portion and the fingers of the fourth portion are arranged opposed to the fingers of the second portion. In this case the first and third portions may be used as a balanced input port, and the second and fourth portions may be used as a balanced output port.

Optionally, for balanced operation, a third metal layer may be located within the piezoelectric layer of the device. Such a third metal layer can assist a high degree of amplitude and phase balance and assist in ensuring that the input and output resonators resonate at the same frequency.

Optionally, impedance transformation may be implemented by employing fingers in the first portion of the first metal layer having a different length than the fingers of the second portion of the first metal layer, and if present, the fingers of the third portion of the second metal layer having a different length than the fingers of the fourth portion of the second metal layer.

Optionally, the device may be implemented with the second metal layer arranged on a reflector and the reflector arranged on a substrate. Such an arrangement provides an SBAR device. The reflector may be a Bragg reflector, but alternatively other types of reflector may be used.

The invention also provides a filter, for example a selectivity filter for a communication receiver, comprising a BAW resonator device according to the first aspect of the invention.

The invention also provides an electronic apparatus, for example a mobile phone or a broadcast receiver, comprising a BAW resonator device according to the first aspect of the invention.

The invention will now be described, by way of example only, with reference to the accompanying drawings wherein.

In the drawings the same reference numerals have been used to indicate corresponding features.

Figure 1:
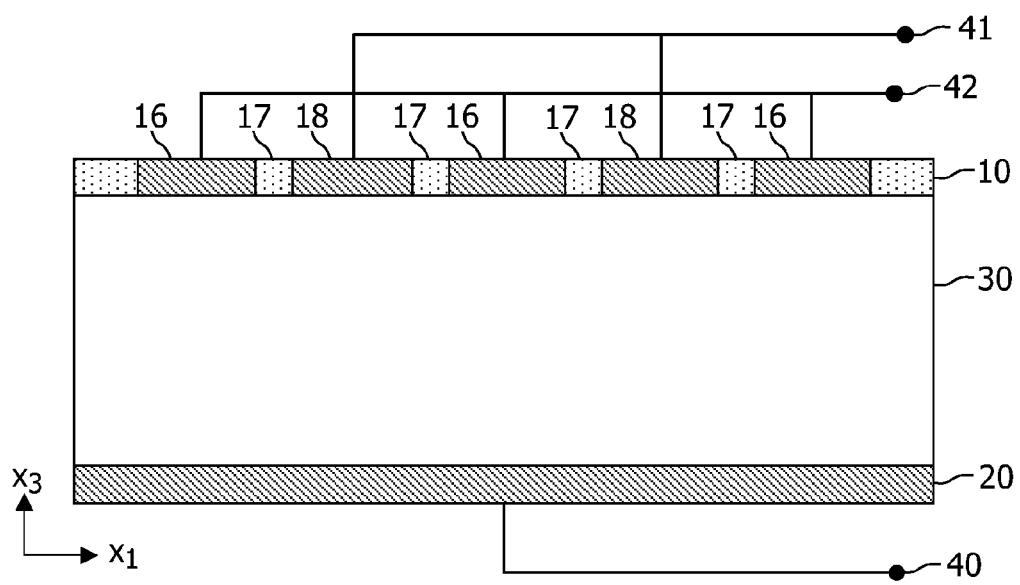
FIG. 1 is a schematic cross-section through a layer structure of a BAW resonator device.
Figure 2:
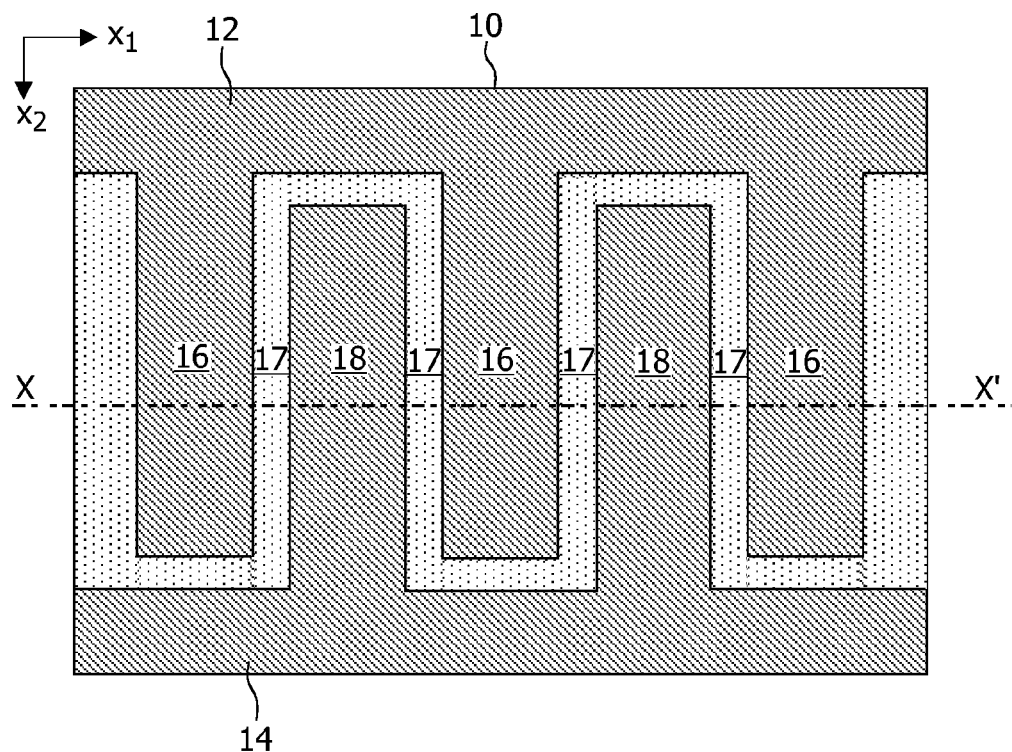
FIG. 2 is a schematic plan view of the upper layer of the layer structure of FIG. 1.

FIG. 1 shows schematically a cross-section through the layers of an FBAR resonator suitable for use in applications requiring unbalanced ports, comprising a first metal layer 10, a second metal layer 20 and an intervening piezoelectric layer 30. FIG. 2 shows schematically a plan view of the layout of the first metal layer 10. The second metal layer 20 is a continuous plane and so is not illustrated in plan view. The cross-section of FIG. 1 corresponds to the line X-X' in FIG. 2. In FIGS. 1 and 2 the first metal layer 10 comprises a first metal portion 12 having a plurality of interconnected fingers 16, and a second metal portion 14 also having a plurality of interconnected fingers 18. The first and second metal portions 12, 14 are spaced apart by gaps 17 containing dielectric planarisation material. The fingers 16 of the first portion 12 are interlaced with the fingers 18 of the second portion 14 thereby providing acoustic coupling between adjacent fingers. For clarity, in FIGS. 1 and 2 the first portion 12 is illustrated having three fingers 18 and the second portion 14 having two fingers 18; in a typical implementation there would be many more fingers.

In use, the first portion 12 of the first metal layer 10 serves as an input electrode and is coupled to an unbalanced input port 42, and the second portion 14 of the first metal layer 10 serves as an output electrode and is coupled to an unbalanced output port 41. The second metal layer 20 is coupled to a ground path 40.

The first and second metal layers 10, 20 are typically aluminium, platinum, molybdenum, tungsten or gold, and have a thickness of the order of 100 nm. The piezoelectric layer is typically aluminium nitride, zinc oxide, or lead zirconate titanate deposited with the C-axis normal to the layer, with thickness of the order of 1-2 µm. Aluminium nitride is the currently preferred material. The dielectric planarisation material may be omitted.

During manufacture, the layered structure illustrated in FIG. 1 is fabricated on a silicon substrate (not illustrated), and the silicon substrate is removed from the acoustically-active regions, typically by micro-machining, so as to provide acoustic isolation and therefore low acoustic loss.

Figure 3:
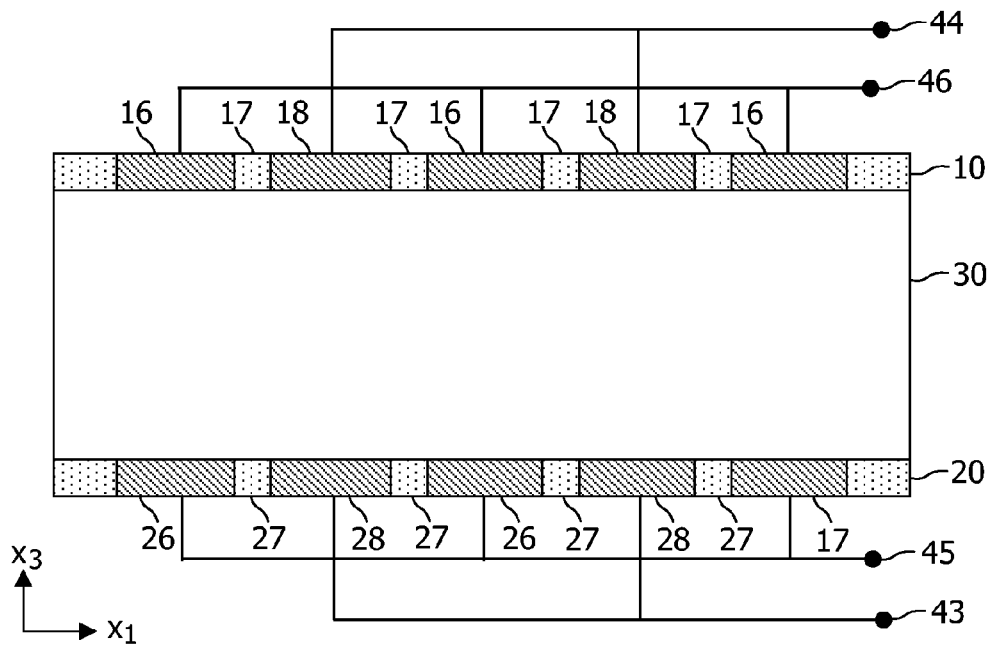
FIG. 3 is a schematic cross-section though a layer structure of a BAW resonator device suitable for balanced operation.

FIG. 3 shows schematically a cross-section through the layers of an FBAR resonator suitable for use in applications requiring balanced ports. The structure is identical to that illustrated in FIG. 1, except that the second metal layer 20 has a layout the same as the first metal layer 10 illustrated in FIG. 2. Only the differences between the structures illustrated in FIGS. 1 and 3 are described; the second metal layer 20 of FIG. 3 is illustrated in plan view in FIG. 4. It comprises a third metal portion 22 having a plurality of interconnected fingers 26, and a fourth metal portion 24 also having a plurality of interconnected fingers 28. The third and fourth metal portions 22, 24 are spaced apart by gaps 27 containing dielectric planarisation material. The fingers 26 of the third portion 22 are interlaced with the fingers 28 of the fourth portion 24 thereby providing acoustic coupling between adjacent fingers. The fingers 26 of the third portion 22 are arranged opposed to, i.e. in a mirror image of, the fingers 16 of the first portion 12, and the fingers 28 of the fourth portion 24 are arranged opposed to the fingers 18 of the second portion 14. In a typical implementation there would be many more fingers than illustrated in FIGS. 3 and 4.

Figure 4:
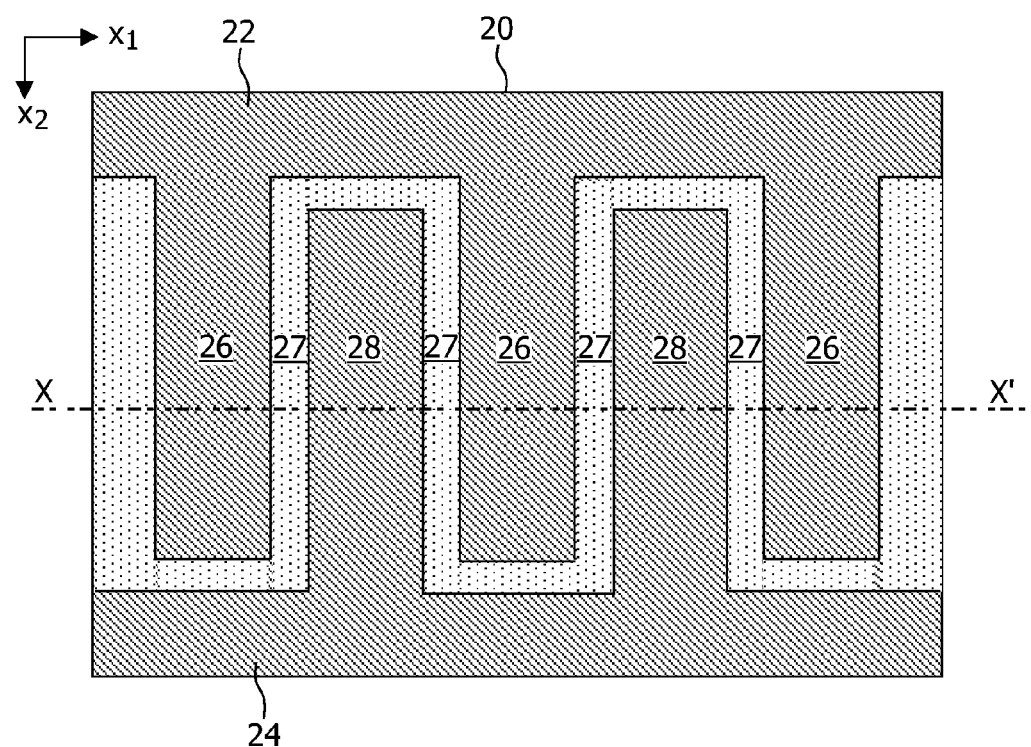
FIG. 4 is a schematic plan view of the lower layer 20 of the layer structure of FIG. 3.

When the structure illustrated in FIGS. 3 and 4 is used in applications requiring balanced ports, the first portion 12 of the first metal layer 10 and the third portion 22 of the second metal layer 20 serve as a pair of input electrodes and are coupled to a balanced input port 43, 44, and the second portion 14 of the first metal layer 10 and the fourth portion 24 of the second metal layer 20 serve as a pair of output electrodes and are coupled to a balanced output port 45, 46.

Figure 5:
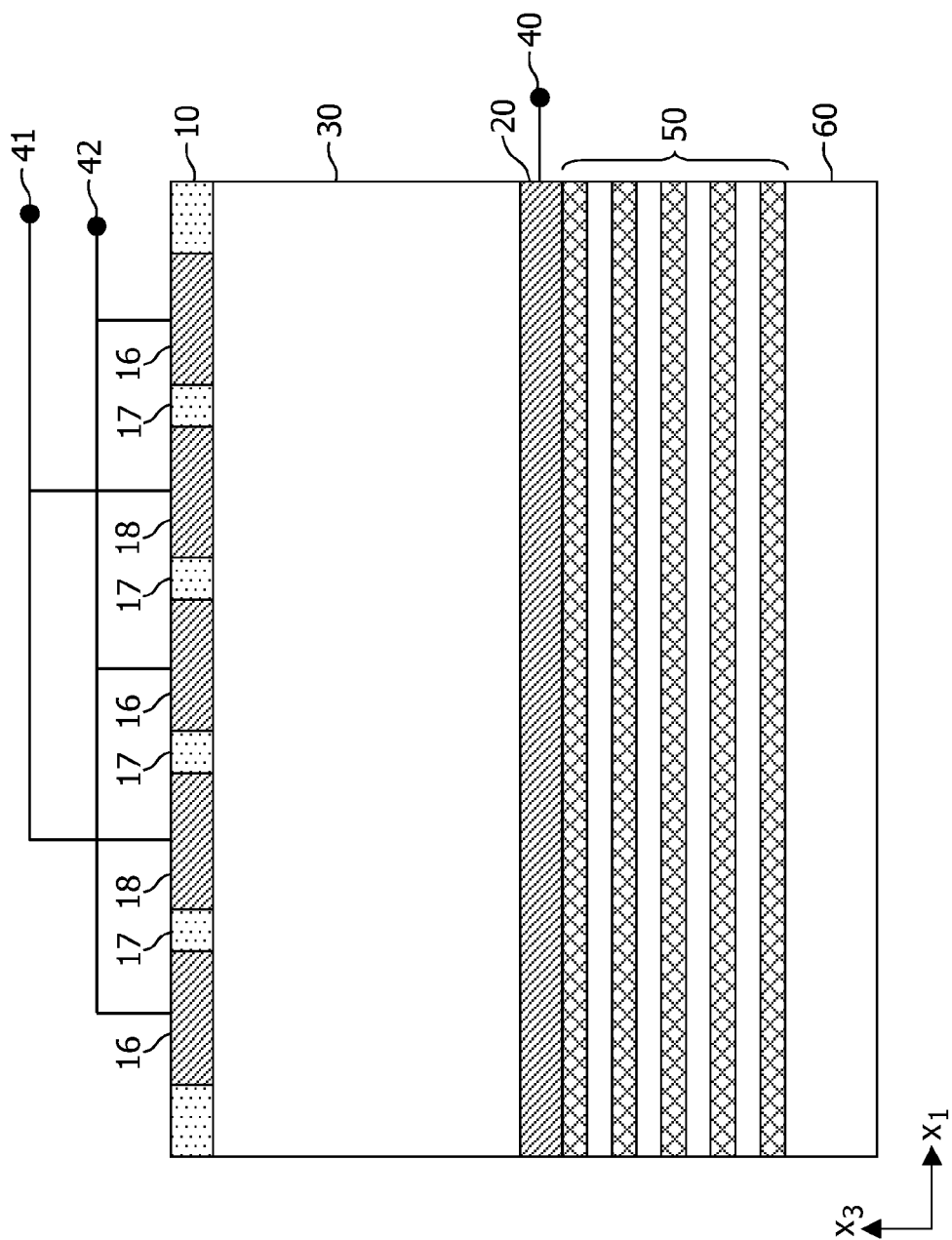
FIG. 5 is a schematic cross-section through a layer structure of an SBAR device.

FIG. 5 shows schematically a cross-section through a layer structure of an SBAR device. The first metal layer 10, second metal layer 20, and the intervening piezoelectric layer 30 are identical to the structure illustrated in FIG. 1, so are not described again. In FIG. 5, the second metal layer 20 is arranged on an acoustic Bragg reflector 50, and the Bragg reflector 50 is arranged on a substrate 60. The Bragg reflector 50 has been discussed above.

Figure 6:
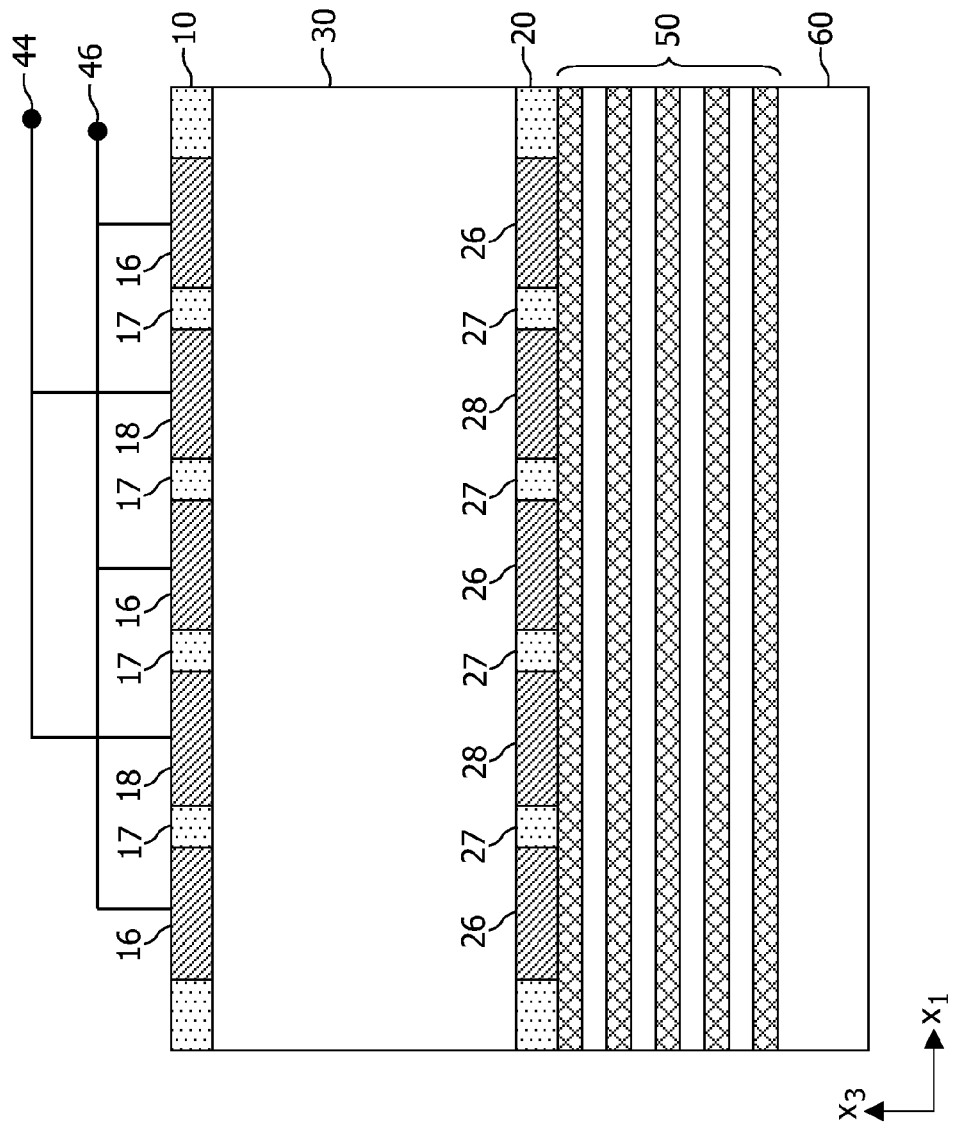
FIG. 6 is a schematic cross-section through a layer structure of an SBAR device suitable for balanced operation.

FIG. 6 shows schematically a cross-section through a layer structure of an SBAR device suitable for use in applications requiring balanced ports. The structure is identical to that illustrated in FIG. 3, except that the second metal layer 20 is arranged on an acoustic Bragg reflector 50, and the Bragg reflector 50 is arranged on a substrate 60. Coupling of the second metal layer 20 to terminals of balanced ports is not illustrated for clarity, but would typically be by means of lateral extension of the second metal layer 20, or by means of vias in the layer structure.

When an alternating electric field is applied between the first and second metal layers 10, 20 an acoustic vibration is excited. For C-axis normal piezoelectric layers the principle acoustic mode is thickness extensional (TE), i.e. motion is normal to the layers. The fundamental TE resonance occurs at a frequency for which the thickness of the combination of the first and second metal layers 10, 20 and the piezoelectric layer 30 is approximately equal to a half-wavelength of this mode. If a BAW resonator were to have first and second metal layers 10, 20 with a high width-to-thickness ratio, say of the order of 100 or more, the acoustic energy would be largely confined to the region defined by their overlap, but additional modes which propagate laterally are excited at the resonator edges giving a small amount of unwanted loss and other second-order effects. For a resonator in accordance with the invention, preferably a low width-to-thickness ratio is used for the fingers 16, 18, 26, 28, say of the order of 10 or less, and so a much higher proportion of energy is converted to the lateral modes, and therefore a much more significant proportion of the acoustic energy is transmitted between adjacent fingers. Therefore, at certain frequencies, the interlaced structures illustrated in FIGS. 1 to 5 provide strong acoustic coupling between adjacent fingers, 16 and 18, and 26 and 28. Thus, for a resonator in accordance with the invention, one of the laterally-propagating waves is deliberately exploited to provide such acoustic coupling between resonators. The use of interlaced fingers has the further advantage of greater coupling due to both edges of all fingers, except the two outermost, being employed in the coupling process.

Figure 7:
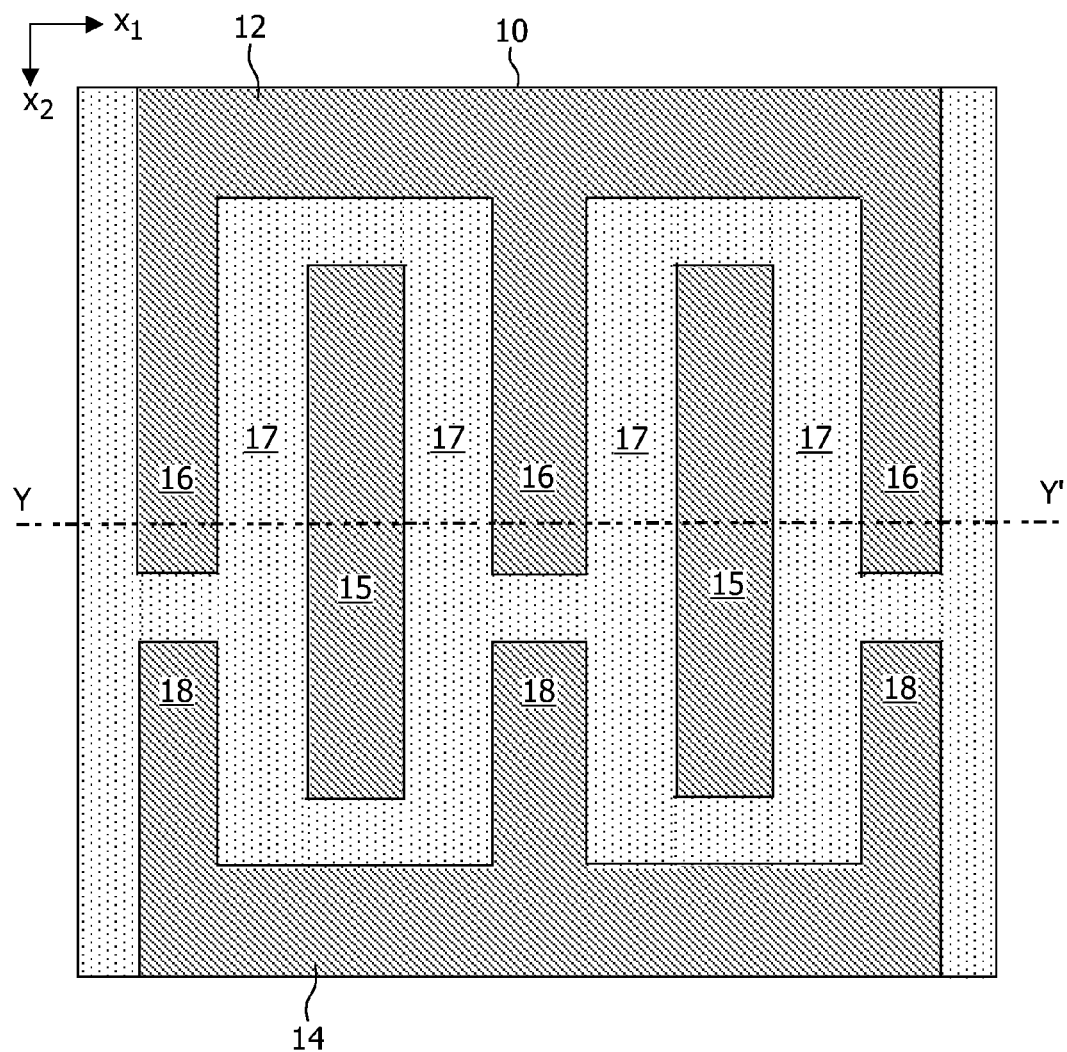
FIG. 7 is a schematic plan view of the upper layer of a further embodiment of a BAW resonator device.

FIG. 7 shows schematically a plan view of an alternative layout of the first metal layer 10. Instead of the fingers 16, 18 of the first and second portions 12, 14 respectively being interlaced as described above with reference to FIG. 4, the fingers 16 of the first portion 12 do not extend between the fingers 18 of the second portion 14. There are further portions 15 located between and spaced from the fingers 16 of the first portion 12 and between and spaced from the fingers 18 of the second portion 14. The further portions 15 provide indirect coupling between the fingers 16 of the first portion 12 and the fingers 18 of the second portion 14. The fingers 16 of the first portion 12 may have a different length than the fingers 18 of the second portion 14; in this way the device provides impedance transformation between the input and output ports.

Figure 8:
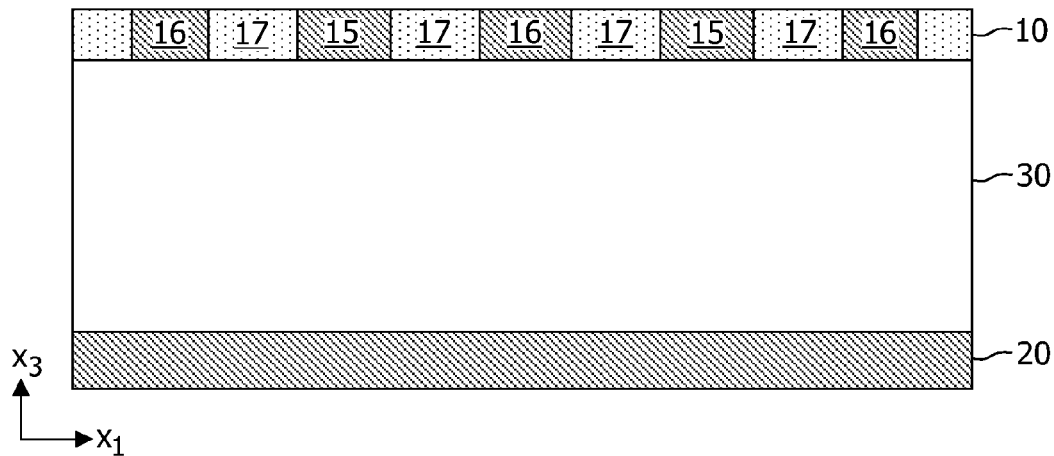
FIG. 8 is a schematic cross-section through the layer structure of a BAW resonator device for the embodiment of FIG. 7.

FIG. 8 shows schematically a cross-section through an FBAR device having a first metal layer 10 as shown in FIG. 7. The cross-section corresponds to the line Y-Y' in FIG. 7. The second metal layer 20 and the piezoelectric layer 30 are as described with reference to FIG. 1. The first and second portions 12, 14 of the first metal layer 10, and the further portions 15, are spaced apart by gaps 17 containing dielectric planarisation material. In a typical implementation there would be many more fingers 16, 18 and further portions 15 than are illustrated in FIGS. 7 and 8.

Although the input and output connections are not illustrated in FIG. 8, in use, the first portion 12 (including fingers 16) of the first metal layer 10 serves as an input electrode and is coupled to an unbalanced input port, the second portion 14 (including fingers 18) of the first metal layer 10 serves as an output electrode and is coupled to an unbalanced output port, and the second metal layer 20 is coupled to a ground path.

Figure 9:
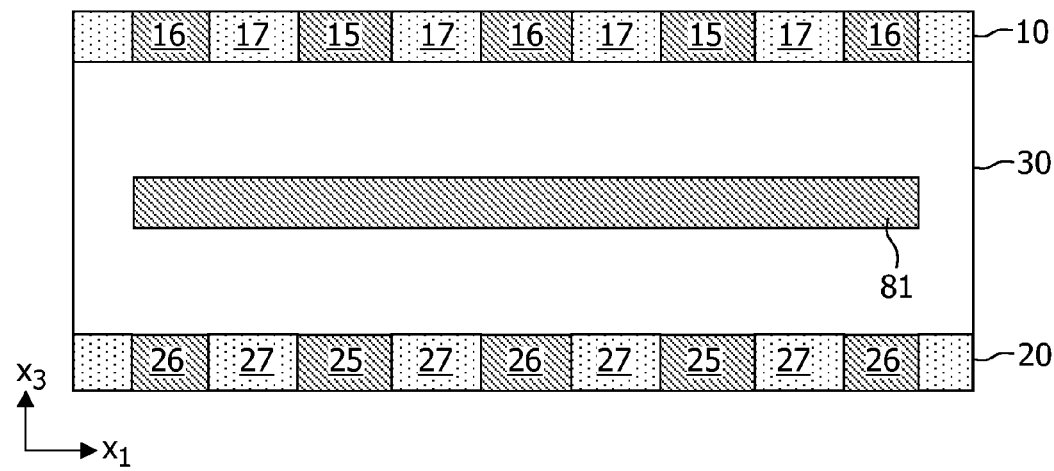
FIG. 9 is a schematic first cross-section through the layer structure of a BAW resonator device employing a third metal layer.

For applications requiring balanced operation, the layout of the second metal layer 20 is the same as the layout of the first metal layer 10 illustrated in FIG. 7; the cross-section at Y-Y'' of such a device is shown schematically in FIG. 9 and shows fingers 26, further portions 25, and gaps 27 containing dielectric planarisation material. For balanced operation, in use, the first portion 12 (including fingers 16) of the first metal layer 10 and the opposing portion (including fingers 26) of the second metal layer 20 are coupled to a balanced input port, and the second portion 14 (including fingers 18) of the first metal layer 10 and the opposing portion (including fingers 28) of the second metal layer 20 are coupled to a balanced output port.

SBAR devices having the structure illustrated in FIGS. 7, 8 and 9 may be constructed by arranging the second metal layer 20 on an acoustic Bragg reflector, and arranging the Bragg reflector on a substrate, in a manner as described above with reference to FIGS. 5 and 6.

The device structures described for balanced operation may also be used for balun operation, i.e. one port balanced and one port unbalanced, by coupling to a ground path the portion of the second metal layer 20 corresponding to the unbalanced port.

Figure 10:
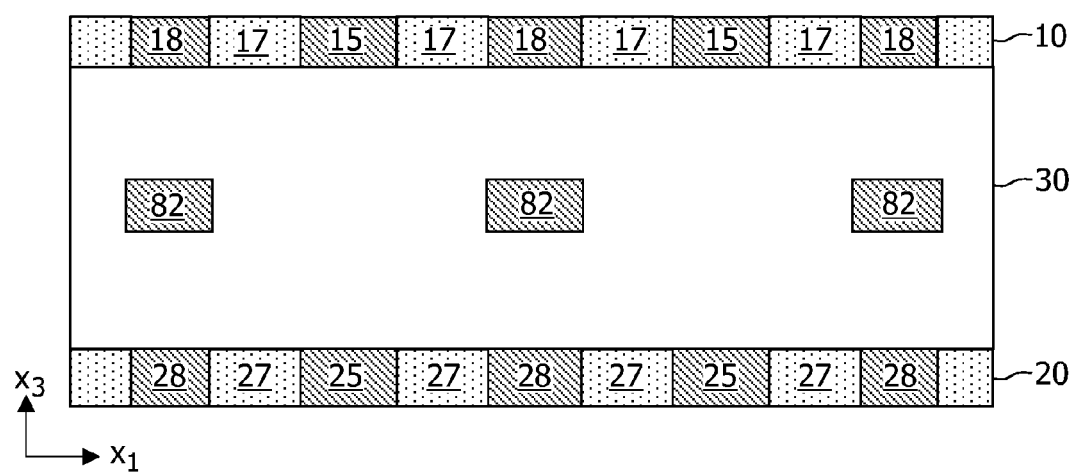
FIG. 10 is a schematic second cross-section through the layer structure of a BAW resonator device employing a third metal layer.
Figure 11:
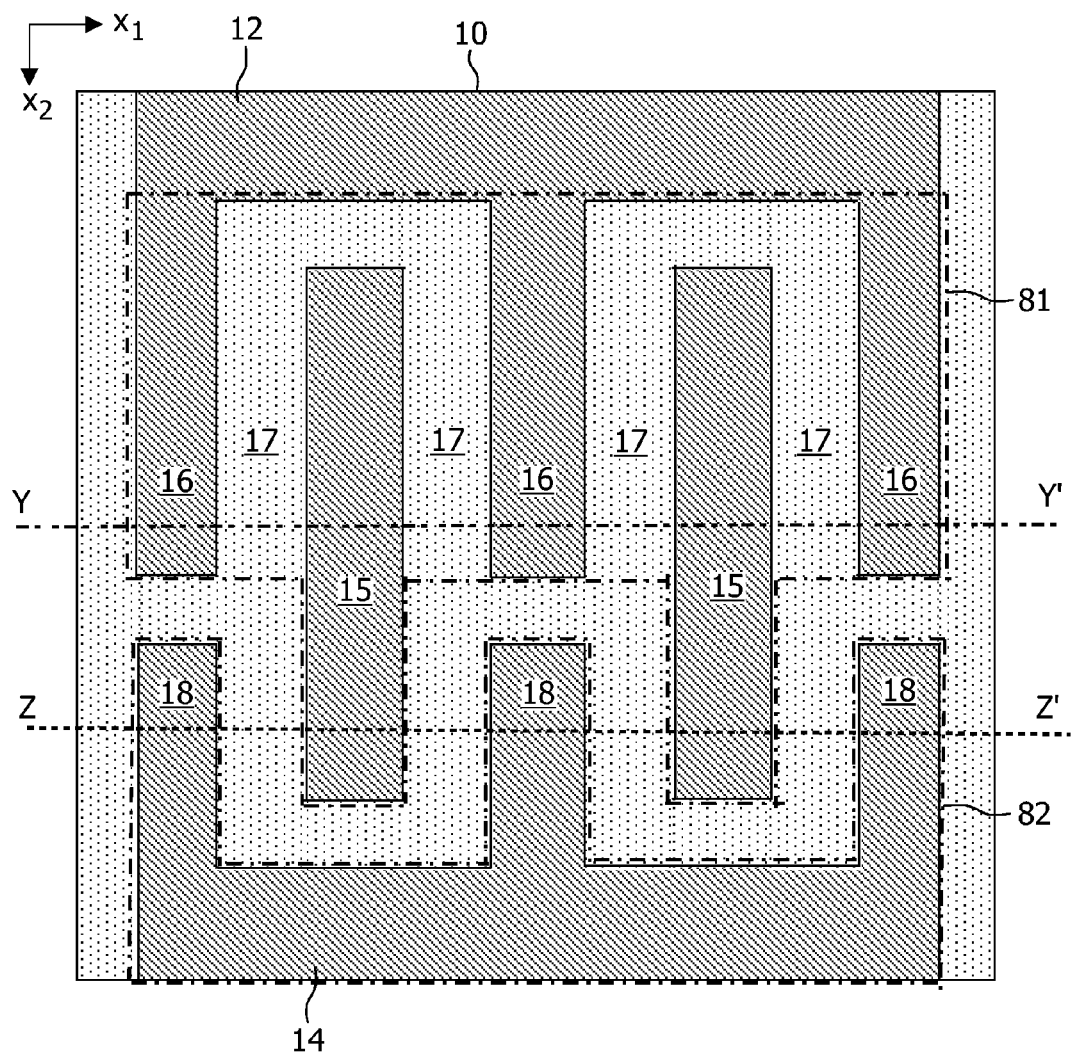
FIG. 11 is a schematic plan view as for FIG. 7, but with the location of a third metal layer illustrated.

A device for use with an unbalanced input port and a balanced output may optionally include a third metal layer within the piezoelectric layer 30. FIG. 11 shows schematically a plan view of a device having a first metal layer 10 as illustrated in FIG. 7, but additionally illustrates the layout of the third metal layer comprising a fifth portion 81 and a sixth portion 82 (dot dash lines). The fifth portion 81 is rectangular in shape encompassing the area of the fingers 16 of the first portion 12, and with additional protruding finger portions corresponding to the further portions 15, and the sixth portion 82 is the same shape as the second portion 14. The fifth portion 81 serves to ensure a high degree of both amplitude and phase balance at the output port. FIG. 9 illustrates schematically a cross-section through the layer structure of the device illustrated in FIG. 11 at the line Y-Y'', where it can be seen that, at this position, the fifth portion 81 is continuous across the device, apart from the edge regions of the piezoelectric layer 30. FIG. 10 illustrates schematically a cross-section through the layer structure of the device illustrated in FIG. 11 at the line Z-Z', where it can be seen that, at this position, the sixth portion 82 comprises a cross-section through the three metal fingers of the third metal layer. In use, the first portion 12 of the first metal layer 10 (including fingers 16) is coupled to an unbalanced input port, the third portion (including fingers 26) of the second metal layer 20 is coupled to a ground path, the fifth portion 81 of the third metal layer is electrically floating and serves to ensure that both the input and output resonators resonate at the same frequency, the second portion 14 (including fingers 18) of the first metal layer 10 and the fourth portion (including fingers 28) of the second metal layer 20 are coupled to a balanced output port, and the sixth portion 82 is coupled to a ground path.

Figure 12:
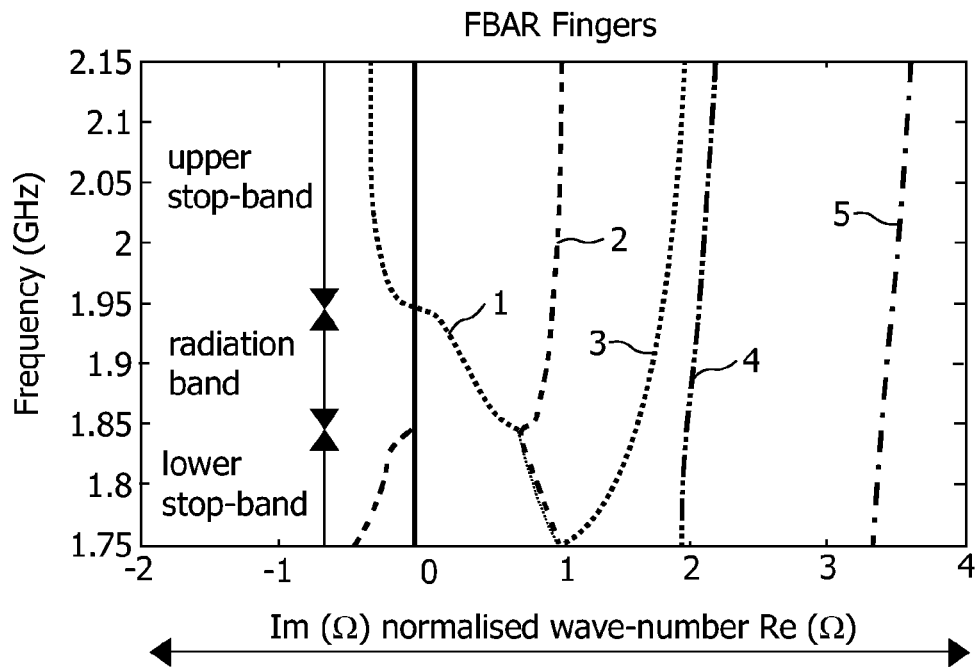
FIG. 12 shows dispersion curves for the finger region of an FBAR structure of FIG. 1.

The dispersion curves for the laterally-guided waves in layered structures in accordance with the invention have been predicted by applying the theory in "Simulation of second order effects in SBAR and FBAR", R. F. Milsom et al, 2nd International Symposium on Acoustic Wave Devices for Future Mobile Communication Systems, Chiba University, Japan, p. 143, March 2004, and are shown in FIGS. 12 to 15. For the data presented in FIGS. 12 to 15, the first metal layer 10 is aluminium of 100 nm thickness and the gaps 17 contain tantalum pentoxide of 100 nm thickness. The convention in dispersion curves is to display frequency on the vertical axis, real part of the normalized wave-number $\Omega$ on the positive horizontal axis, and imaginary part of the normalized wave-number 106 on the negative horizontal axis. Dispersion curves for the five most significant laterally-guided waves in FBARs, which are all Lamb-type waves, are shown in FIG. 12 for the finger regions, and in FIG. 13 for the gap regions.

Figure 13:
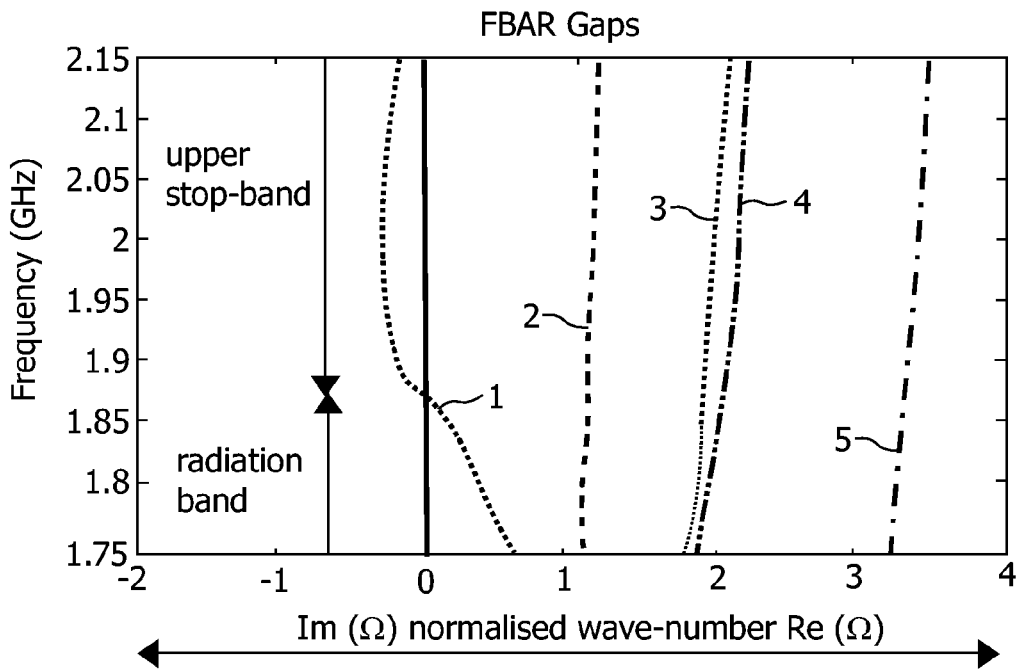
FIG. 13 shows dispersion curves for the gap region of an FBAR structure of FIG. 1.

Referring to FIG. 12, the curve labelled 1 (square dots) corresponds to the laterally-guided TE wave, which actually includes a significant parallel ($x_1$-directed) component as well as normal ($x_3$-directed) component of motion, and is pure TE only at one of its cut-off frequencies, in this case 1.95 GHz. This is the principal mode employed for lateral coupling. FIG. 13 shows corresponding curves for the gap regions. For both finger and gap regions there are distinct frequency bands as indicated in FIGS. 12 and 13. In the upper stop-band the wave-number is imaginary so mode 1 is strongly attenuated in the $x_1$-direction, while in the radiation-band mode 1 propagates unattenuated, and in the lower stop-band modes 1 and 2 have complex conjugate wave-numbers and are both strongly attenuated. A high Q-factor lateral resonance can only occur at a given frequency if this lies in both the radiation-band of the finger regions and one of the stop-bands in the gap regions. Such resonances are referred to as "energy-trapped" modes because they combine standing waves in the finger regions, due to internal reflection at finger edges, and evanescent disturbances in the gap and end regions, i.e. the amplitude of vibration decays rapidly away from the edges outside the finger regions. The required off-set between frequency bands of the finger and gap regions may be achieved in one of two alternative ways. Either the first metal layer 10 is formed of a relatively heavy metal, e.g. platinum, which shifts the finger region radiation band down to overlap the gap region lower stop-band, or (as in the case illustrated in FIGS. 12 and 13) the top electrode is formed of a light metal (aluminium in this case) and the gaps are filled with a heavy dielectric (in this case tantalum pentoxide) planarization layer, which shifts the gap-region upper stop-band down to overlap the finger-region radiation-band. Loading the gaps (either with a dielectric material, or a metal, possibly grounded, and with a very small gap to provide electrical isolation) is optional in the first case, but planarisation is still recommended in order to minimize the acoustic discontinuity at electrode edges, and so reduce energy conversion between wanted and unwanted lateral waves.

Figure 14:
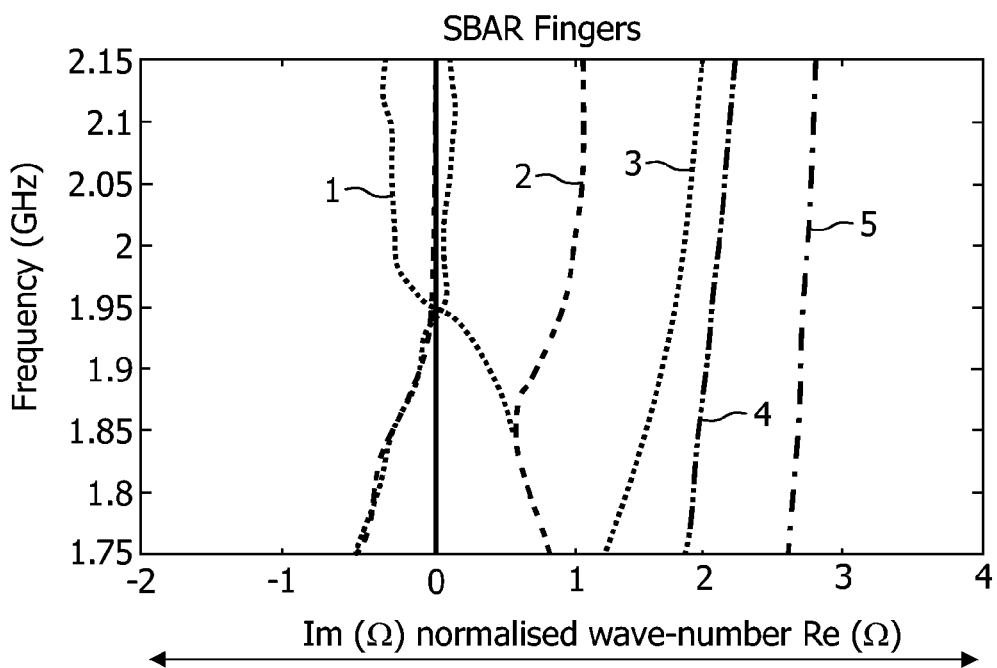
FIG. 14 shows dispersion curves for the finger region of an SBAR structure of FIG. 5.
Figure 15:
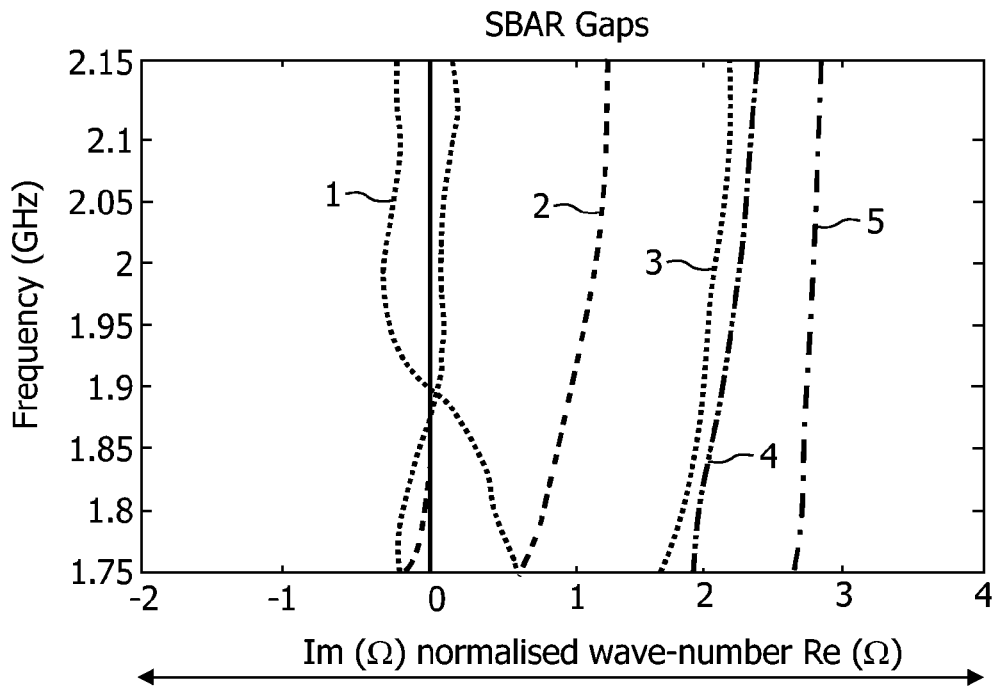
FIG. 15 shows dispersion curves for the gap region of an SBAR structure of FIG. 5.

The SBAR dispersion curves are shown in FIGS. 14 and 15. These waves are Rayleigh-type surface acoustic waves (SAW), some of which are leaky at some frequencies, i.e. energy leaks through the Bragg reflector. It can be seen that the behaviour of mode 1 only approximates that discussed above for the FBAR case. Distinct radiation-bands and stop-bands do not occur, so filter behaviour can be expected to differ.

Figure 16:
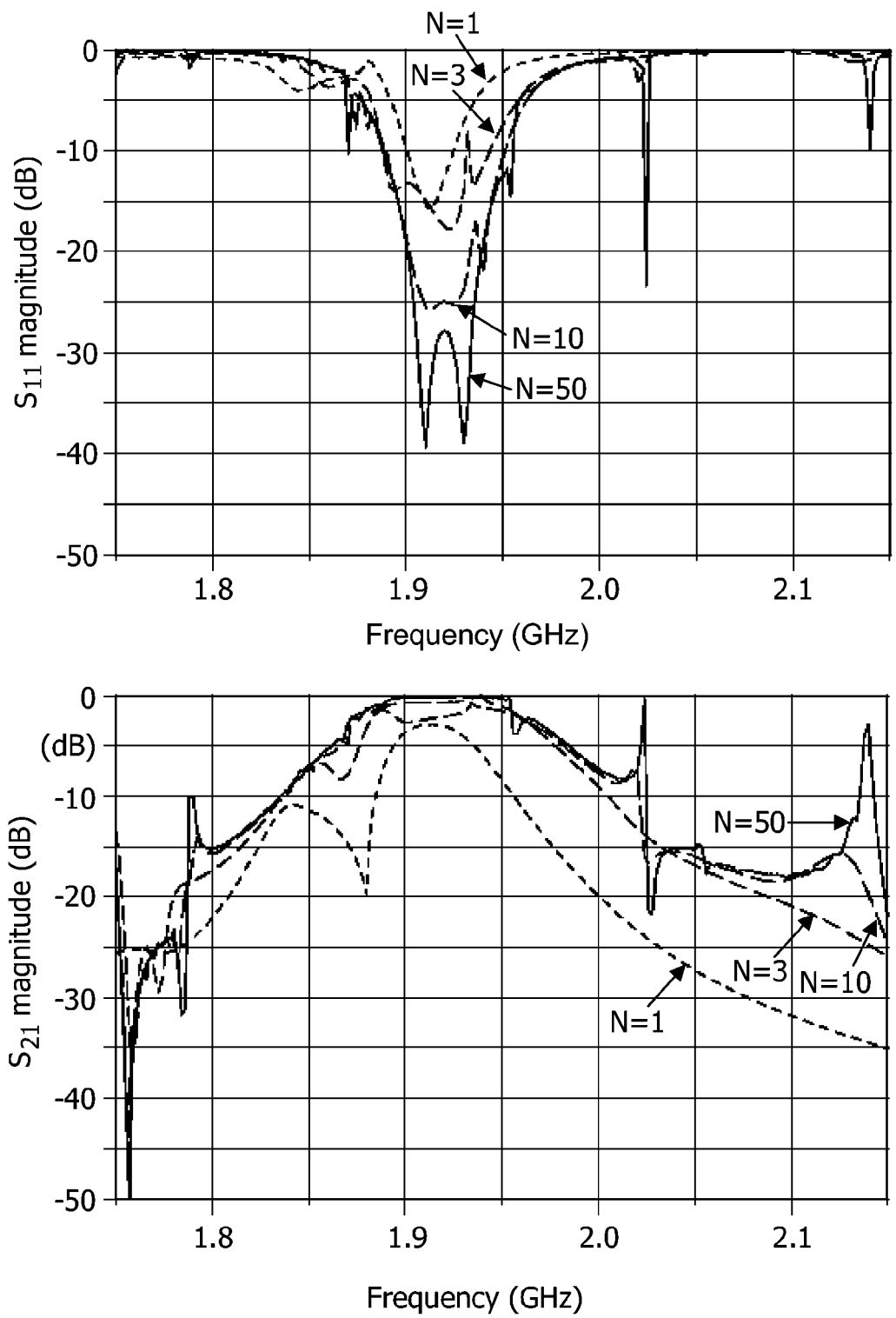
FIG. 16 shows the magnitude of the S-parameters $S_{11}$ and $S_{12}$ for a wide-band BAW filter employing an FBAR, for different numbers of fingers.

FIG. 16 shows the magnitude of the electrical scattering parameters (S-parameters, $S_{11}$ and $S_{12}$) for a wide-band BAW filter employing an FBAR having the structure illustrated in FIGS. 1 and 2, but with various numbers of fingers. The first metal layer 10 is 100 nm of aluminium, with the planarisation material in the gaps 17 between the fingers 16, 18 being 100 nm of tantalum pentoxide. To achieve a wide bandwidth in this example the widths of fingers 16, 18 and gaps 17 are required to be 5 μm and 2 μm respectively. For the data presented in FIG. 16 the number N of fingers 16 in the first portion 12 (for the input electrode) and fingers 18 in the second portion 14 (for the output electrode), and the lengths W of the fingers 16, 18, and the area A of the acoustically active area comprising the fingers 16, 18 and gaps 17, are as follows:

| N | W | A |
| --- | --- | --- |
| 1 | 3.094 mm | 0.0371 mm² |
| 3 | 1.962 mm | 0.0784 mm² |
| 10 | 0.590 mm | 0.0814 mm² |
| 50 | 0.119 mm | 0.0831 mm² |

In all cases the finger length W is chosen for optimum match to 50 ohms, and an uncritical 2 nH inductor has been added in series with each port to flatten a small (≈1 dB) dip in the centre of the pass-band. Note that increasing the number of fingers has several effects:

(1) The in-plane aspect ratio of the fingers is lower, and the number of fingers electrically in parallel is greater, giving lower series electrical resistance.

(2) Insertion loss is lower across the pass-band due to increased acoustic coupling.

(3) Electrical matching at ports is improved.

(4) Total acoustically active area is hardly increased (N=1 is a special case which has very poor performance). In addition the overall aspect ratio of this area becomes more reasonable.

(5) Sharpness of unwanted responses in the stop-band is increased.

All these effects are beneficial except the last.

Figure 17:
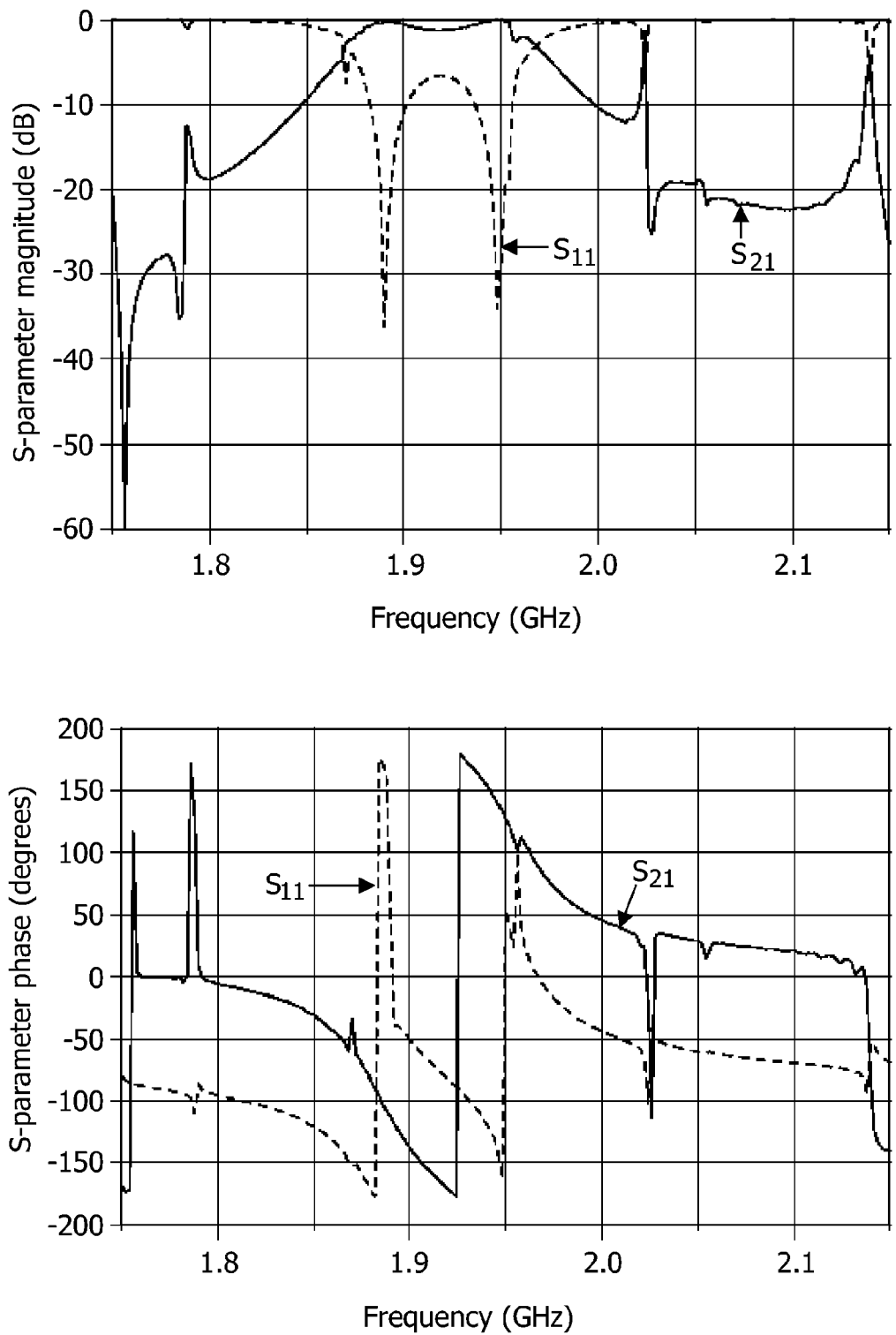
FIG. 17 shows the magnitude and phase of the S-parameters $S_{11}$ and $S_{12}$ for a wide-band BAW filter employing an FBAR.
Figure 18:
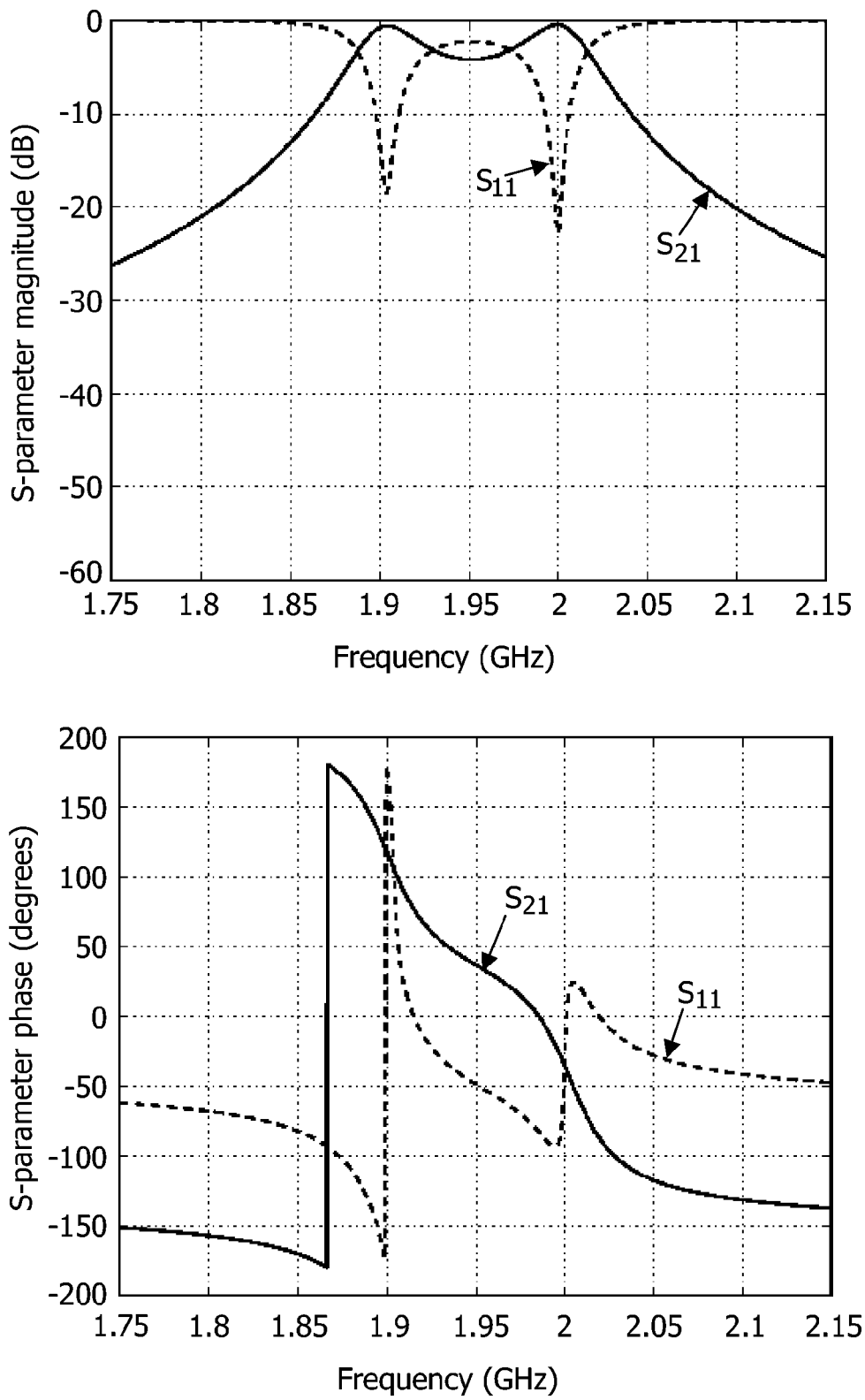
FIG. 18 shows the magnitude and phase of the S-parameters $S_{11}$ and $S_{12}$ for a wide-band BAW filter employing prior art vertically coupled SBAR resonators.

A comparison is presented of the predicted frequency response of the S-parameters of an FBAR filter, in FIG. 17, with 50 fingers in each of the first and second metal portions 12, 14 in accordance with the invention, and of a prior art vertically-coupled SBAR, in FIG. 18, with 3 coupling layers. The data presented in FIG. 17 is for a filter having fingers of width 5 µm and thickness 100 nm, and a gap width of 2 µm containing tantalum pentoxide planarisation material of 100 nm thickness. The piezoelectric layer 30 material and the metal layer 10, 20 material (100 nm of aluminium) are the same for both FIGS. 17 and 18. The reflector and coupling layer materials in the SBAR are silicon dioxide ($SiO_2$) and tantalum pentoxide ($Ta_2O_5$). The acoustic Bragg reflector has 6 and 5 layers of $SiO_2$ and $Ta_2O_5$ respectively. The coupler has 3 and 2 layers of $SiO_2$ and $Ta_2O_5$ respectively. The FBAR predictions were performed using the 2-dimensional analytical model described by Milsom et al referenced above. This is necessary because the laterally-propagating waves dominate behaviour. The SBAR simulations were performed using the 1-dimensional model which is a subset of the 2-dimensional model and ignores the laterally propagating waves. This has been shown to be a good approximation for such structures, since the normally incident TE wave then dominates behaviour. The series inductors at the ports, which were included in the predictions in FIG. 16 are omitted from the simulations of FIGS. 17 and 18 to illustrate the dip in $S_{21}$ and the poor match indicated by the high value of $S_{11}$ that arises at the centre-frequency from the BAW device alone, when a relatively high bandwidth is required. Several comments are made on the data presented in FIGS. 16, 17 and 18:

(1) No attempt was made to design the bandwidths of the FBAR of FIG. 17 and the vertically-coupled SBAR of FIG. 18 to be exactly the same, but it is stressed again that this is continuously adjustable for laterally-coupled fingers because it is a function of the widths of the fingers and gaps which are defined freely in the mask, while it can only be adjusted in discrete steps for vertically-coupled resonators because it is a function of the number of coupling layers which is an integer.

(2) The general shape of the frequency response is the same for the FBAR of FIG. 17 and the vertically-coupled SBAR of FIG. 18, but clearly there are many out-of-band responses in the FBAR, whereas the response of the vertically-coupled SBAR is spurious-free. In the case of the vertically-coupled SBAR, laterally-propagating waves which were excluded from the simulations would introduce some spurious responses in practice but only at a low level.

(3) FIG. 16 shows there are trade-offs between the number of fingers, the pass-band insertion loss and the strength of out-of-band responses. However, the best approach is probably to have a larger number of fingers (for the reasons discussed above) and either suppress or exploit the unwanted responses by other means.

(4) The out-of-band resonances may appear to represent a problem in terms of filter response, but can be exploited to advantage. They occur in the stop-bands of mode 1 for the finger regions, and therefore cannot be due to this wave. Each of these responses are actually associated with multiple internal reflections of one of the other waves (typically mode 2 or mode 3) which are travelling waves. Unlike the two main resonances near the edges of the pass-band they are not energy-trapped in the normally accepted sense i.e. the wave-number of the guided wave in question is real in all regions. The resonances can be suppressed, or otherwise modified, by introducing non-uniformity into the layer structure in which finger and gap widths vary along the structure, thus reducing the coherence of the internal reflections. Alternatively, a narrow gap (i.e. a longitudinal slot) can be introduced along the centre of each finger, while maintaining the electrical connection between the two halves. The different nature of energy-trapped and non-energy-trapped resonance suggest that they can be modified independently in the design, at least to some extent. It is clear that deep nulls can be introduced into the stop-band and these could be designed to be at frequencies that must be particularly strongly rejected. In general the pass-band and stop-band can both be fully tailored. This design flexibility is not available for vertically-coupled resonators.

(5) FIGS. 14 and 15 indicate that, for an SBAR finger structure in accordance with the invention, in the finger regions the wave-number for mode 1 is complex at all frequencies except cut-off. This is due to leakage of acoustic energy through the reflector, and results in a higher insertion loss than predicted for the FBAR designs. On the other hand, mode-conversion to the other lateral modes will be weaker, because these are surface acoustic waves (SAW) which penetrate less into the structure than mode 1. Consequently the out-of-band responses will be reduced for the SBAR.

(6) Laterally-coupled resonators employ a much simpler technology than vertically coupled resonators. The number of layers is significantly fewer. In addition, filter frequency-trimming, e.g. to correct for spread over a wafer, is easier. For example adding a thin layer of dielectric such as silicon dioxide locally over part of a wafer will reduce the centre frequency without significantly modifying filter response shape. In comparison, such an approach applied to vertically-coupled resonators modifies the top resonator to a greater extent than the bottom resonator, and therefore changes both frequency and response shape.

(7) Optionally, improved stop-band attenuation can be achieved by cascading two or more laterally-coupled resonator sections with slight differences in gap and/or finger widths in the different sections so that the sharp out-of-band resonances do not reinforce one another.

(8) Optionally, additional resonators, with both top and bottom electrode fingers grounded may be interposed between the fingers of the input and output electrodes to provide both higher order filtering and electromagnetic shielding between input and output ports. An example of such a finger arrangement is: input, ground, ground, output, ground, ground, input, . . . ground, ground, output. In principle, any arrangement of parallel input, output and ground fingers may be employed.

Figure 19:
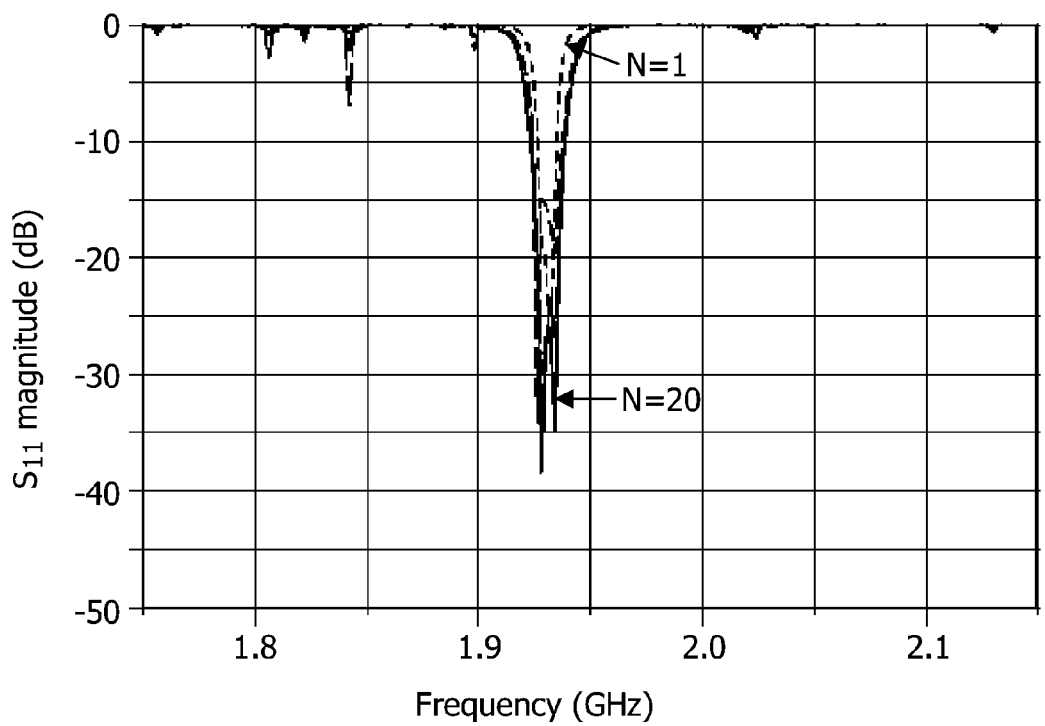
FIG. 19 shows the magnitude of the S-parameters $S_{11}$ and $S_{12}$ for a narrow-band BAW filter employing an FBAR, for different numbers of fingers.
Figure 19:
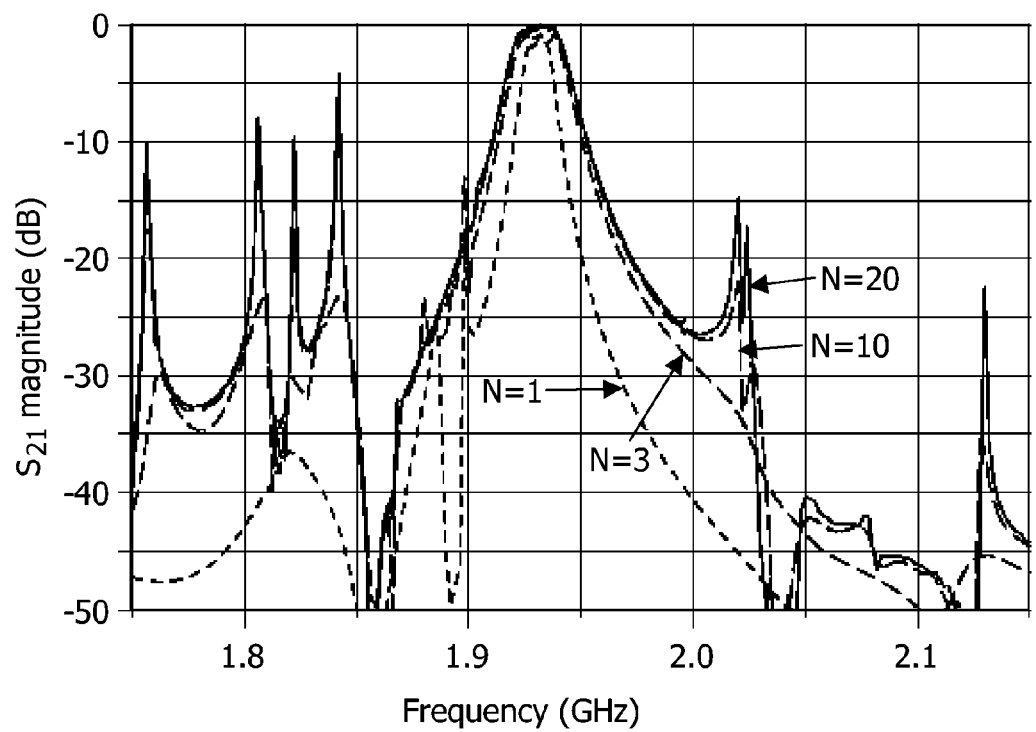
Figure 20:
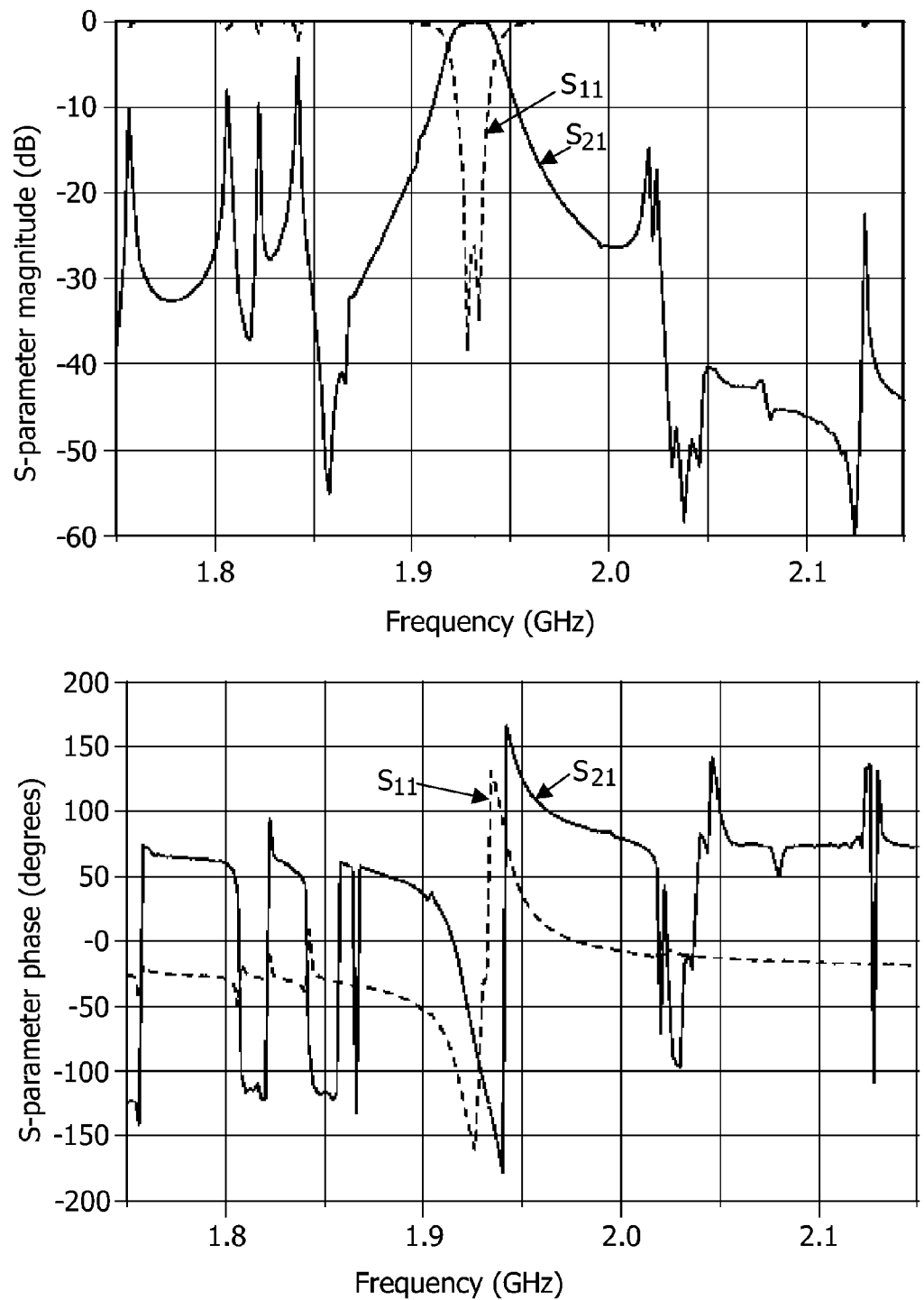
FIG. 20 shows the magnitude and phase of the S-parameters $S_{11}$ and $S_{12}$ for a narrow-band BAW filter employing an FBAR.
Figure 21:
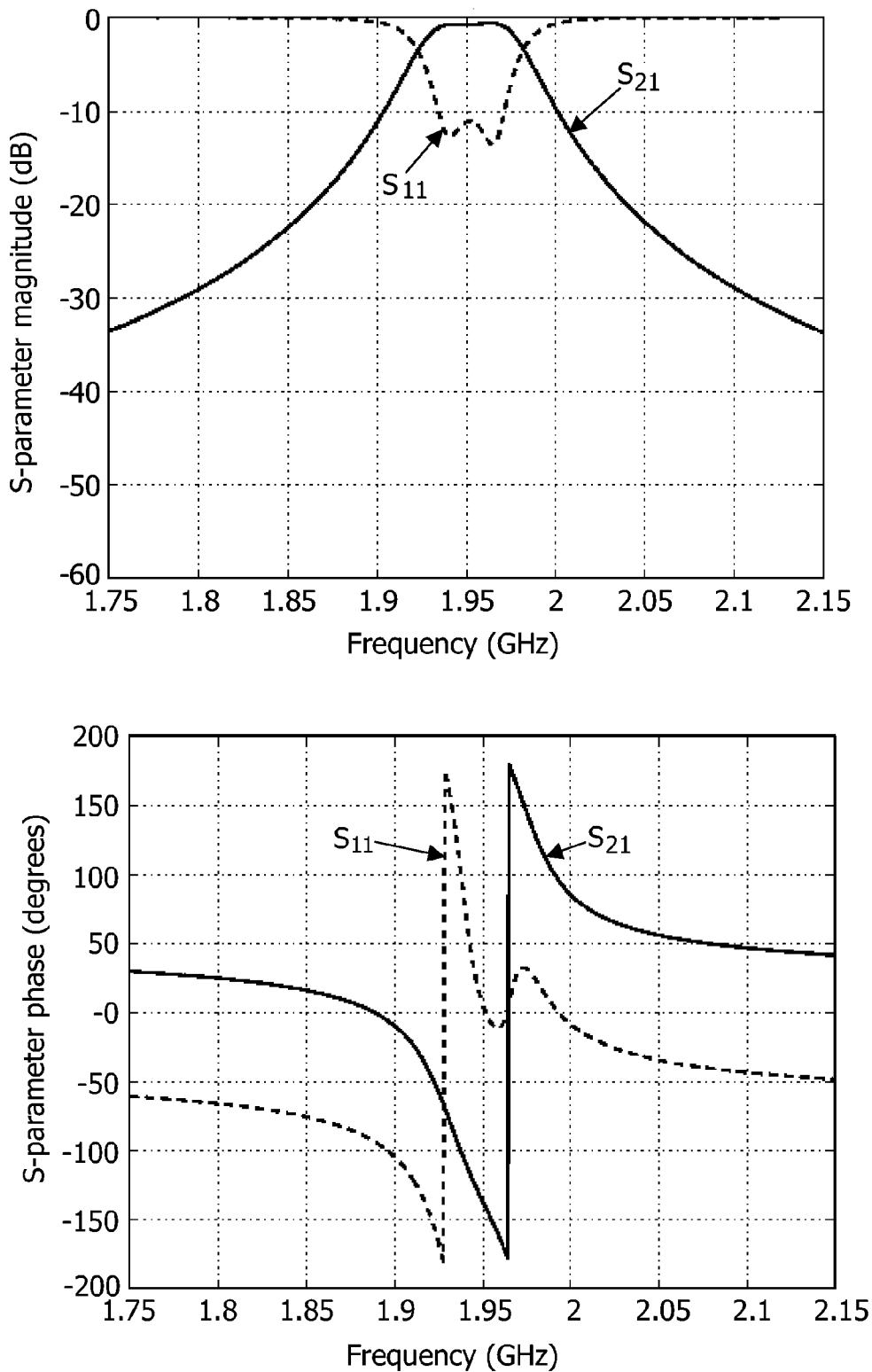
FIG. 21 shows the magnitude and phase of the S-parameters $S_{11}$ and $S_{12}$ for a narrow-band BAW filter employing prior art vertically coupled SBAR resonators.

FIGS. 19, 20 and 21 show results similar to FIGS. 16, 17 and 18, but for filters with narrower bandwidth. To achieve a narrow bandwidth requires less acoustic coupling, which is achieved, in the device in accordance with the invention, by using wider fingers and gaps, the widths of the fingers 16, 18 and the gaps 17 being 10 μm and 3 μm respectively, and, in the vertically-coupled device, by increasing the number of coupling layers to 5. The material of the first metal layer 10 and the planarisation material are the same as for FIGS. 16, 17 and 18.

For the data presented in FIG. 19 the number N of fingers 16 in the first portion 12 (for the input electrode) and fingers 18 in the second portion 14 (for the output electrode), and the lengths W of the fingers 16, 18, and the area A of the acoustically active area comprising the fingers 16, 18 and gaps 17, are as follows:

| N | W | A |
|---|---|---|
| 1 | 0.324 mm | 0.0075 mm$^2$ |
| 3 | 0.209 mm | 0.0157 mm$^2$ |
| 10 | 0.065 mm | 0.0167 mm$^2$ |
| 20 | 0.033 mm | 0.0171 mm$^2$ |

The frequency response in FIGS. 19, 20 and 21 is more natural in the sense that a flat response and excellent impedance match to the terminations is now achieved without the series inductors. This illustrates an advantage of acoustic coupling over conventional ladder and lattice filters for narrow bandwidth applications. Reducing bandwidth in the latter is always accompanied by an increase in insertion loss. On the other hand, narrow-band acoustically-coupled filters are predicted to have very low insertion loss. The general conclusions are the same for wide and narrow bandwidth, but the unwanted out-of-band responses are weaker and the total active area is much less in the narrow-band case. The results in FIGS. 16 to 21 show that a range of bandwidths can be achieved using lateral coupling without any modification to the layer stack. This is a distinct advantage of devices using lateral acoustic coupling over devices employing vertical acoustic coupling.

Optionally, the planarisation material may be omitted from the gaps 17, 27 but if present should be the same in the gaps 17 of the first metal layer and the gaps 27 of the second metal layer.

Within the features of the invention, a great deal of design freedom is available whilst still benefiting from the advantages of the invention. In particular, one or more of the following features, some of which have been mentioned above, may be included in the BAW resonator device to shape the frequency response of the device and provide input and output impedances to suit any particular application:

at least some of the fingers 16 of the first portion 12 may be of unequal length and/or at least some of the fingers 18 of the second portion 14 may be of unequal length;

the length of at least some of the fingers 16 of the first portion 12 and the length of at least some of the fingers 18 of the second portion 14 may be unequal;

at least some of the fingers 16 of the first portion 12 may be of unequal width and/or at least some of the fingers 18 of the second portion 14 may be of unequal width;

the width of at least some of the fingers 16 of the first portion 12 and the width of at least some of the fingers 18 of the second portion 14 may be unequal;

the gaps between at least some of the fingers 16 of the first portion 12 may be of unequal width and/or the gaps between at least some of the fingers 18 of the second portion 14 may be of unequal width.

The embodiments illustrated in the figures have straight fingers. However this is not an essential requirement. The claims are intended to encompass straight and non-straight fingers. Examples of non-straight fingers are curved, zig-zag or spiral shapes.

In the present specification and claims the word "a" or "an" preceding an element does not exclude the presence of a plurality of such elements. Further, the word "comprising" does not exclude the presence of other elements or steps than those listed.

The inclusion of reference signs in parentheses in the claims is intended to aid understanding and is not intended to be limiting.

From reading the present disclosure, other modifications will be apparent to persons skilled in the art. Such modifications may involve other features which are already known in the art of thin-film bulk acoustic wave devices and their applications and which may be used instead of or in addition to features already described herein.

The invention claimed is:

1. A bulk acoustic wave, BAW, resonator device comprising first and second metal layers and an intervening piezoelectric layer, the first metal layer comprising spaced first and second portions, wherein the first and second portions are each arranged as a plurality of interconnected fingers, and wherein each of the plurality of fingers of the first portion is acoustically coupled to at least one of the fingers of the second portion, and the second metal layer comprises spaced third and fourth portions, wherein the third and fourth portions are each arranged as a plurality of interconnected fingers, wherein the fingers of the third portion are arranged opposed to the fingers of the first portion and the fingers of the fourth portion are arranged opposed to the fingers of the second portion, wherein the first metal layer comprises a first plurality of further portions arranged to provide acoustic coupling between the fingers of the first portion and the fingers of the second portion, the second metal layer comprises a second plurality of further portions arranged to provide acoustic coupling between the fingers of the third portion and the fingers of the fourth portion, and wherein the first portion is coupled to an input port and the second portion is coupled to an output port.

2. A BAW resonator device as claimed in claim 1, further comprising a third metal layer located within the piezoelectric layer.

3. A BAW resonator device as claimed in claim 2, wherein the third metal layer comprises a fifth portion and a sixth portion, wherein the fifth portion is rectangular in shape and substantially encompasses the area of the fingers of the first portion with additional finger portions corresponding to the further portion and wherein the sixth portion is substantially the same shape as the second portion.

4. A BAW resonator device as claimed in claim 1, wherein the first and second portions of the first metal layer and the first further portions are spaced apart by gaps comprising dielectric material.

5. A BAW resonator device as claimed in claim 1, wherein the third and the fourth portions of the second metal layer and the second further portions are spaced apart by gaps comprising dielectric material.

6. A BAW resonator device as claimed in claim 1, wherein the second metal layer is arranged on a reflector and the reflector is arranged on a substrate.

7. A BAW resonator device as claimed in claim 1, wherein at least one of the fingers comprises a longitudinal slot.

8. A BAW resonator device as claimed in claim 1, further comprising one or more of:

at least some of the fingers of the first portion are of unequal length and/or at least some of the fingers of the second portion are of unequal length;

the length of at least some of the fingers of the first portion and the length of at least some of the fingers of the second portion are unequal;

at least some of the fingers of the first portion are of unequal width and/or at least some of the fingers of the second portion are of unequal width;

the width of at least some of the fingers of the first portion and the width of at least some of the fingers of the second portion are unequal;

the gaps between at least some of the fingers of the first portion are of unequal width and/or the gaps between at least some of the fingers of the second portion are of unequal width.

9. A filter comprising a BAW resonator device as claimed in claim 1.

10. An electronic apparatus comprising a BAW resonator device as claimed claim 1.

11. A BAW resonator device as claimed in claim 6, wherein the reflector is a Bragg reflector.

* * * * *